United States Patent
Konno et al.

(10) Patent No.: US 9,646,867 B2
(45) Date of Patent: May 9, 2017

(54) PLASMA PROCESSING APPARATUS, POWER SUPPLY UNIT AND MOUNTING TABLE SYSTEM

(71) Applicant: TOKYO ELECTRON LIMITED, Tokyo (JP)

(72) Inventors: Masahiko Konno, Miyagi (JP); Masayuki Shintaku, Miyagi (JP); Takashi Suzuki, Miyagi (JP); Michitaka Aita, Miyagi (JP); Taizo Okada, Miyagi (JP); Naohiko Okunishi, Miyagi (JP); Hideo Kato, Miyagi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 268 days.

(21) Appl. No.: 14/519,903

(22) Filed: Oct. 21, 2014

(65) Prior Publication Data

US 2015/0109716 A1    Apr. 23, 2015

(30) Foreign Application Priority Data

Oct. 22, 2013   (JP) ................................. 2013-219281

(51) Int. Cl.
*H01L 21/683* (2006.01)
*H01J 37/32* (2006.01)
*H01L 21/67* (2006.01)

(52) U.S. Cl.
CPC .... *H01L 21/6831* (2013.01); *H01J 37/32192* (2013.01); *H01J 37/32311* (2013.01);
(Continued)

(58) Field of Classification Search
CPC ............ H01L 21/67103; H01L 21/6831; H01J 37/32192; H01J 37/32311; H01J 37/32577; H01J 37/32715; H01J 37/32724
(Continued)

(56) References Cited

U.S. PATENT DOCUMENTS 5,099,096 A * 3/1992 Kimrey, Jr. ............ G01N 25/16
219/705
2011/0126765 A1    6/2011 Yamazawa et al.

FOREIGN PATENT DOCUMENTS

JP    2011-135052 A    7/2011

* cited by examiner

*Primary Examiner* — Thienvu Tran
*Assistant Examiner* — Kevin J Comber
(74) *Attorney, Agent, or Firm* — Rothwell, Figg, Ernst & Manbeck, P.C.

(57) ABSTRACT

A plasma processing apparatus includes a mounting table including a lower electrode and an electrostatic chuck, a high frequency power supply electrically connected to the lower electrode, a heater provided in the electrostatic chuck, a heater power supply for supplying a power to the heater, a filter unit including a filter connected to the heater power supply, a rod-shaped power feeder connecting the heater power supply and the heater via the filter, an insulating tubular portion having an inner hole through which the power feeder extends, and a conductive choke portion serving to suppress a microwave propagating through the tubular portion. The choke portion includes a first portion extending from the power feeder in a direction intersecting with a longitudinal direction of the power feeder and a cylindrical second portion extending, between the tubular portion and the power feeder, from a peripheral portion of the first portion.

14 Claims, 14 Drawing Sheets

(52) U.S. Cl.
CPC .. *H01J 37/32577* (2013.01); *H01J 37/32715* (2013.01); *H01J 37/32724* (2013.01); *H01L 21/67103* (2013.01)

(58) Field of Classification Search
USPC ........................................................ 361/234
See application file for complete search history.

PLASMA PROCESSING APPARATUS, POWER SUPPLY UNIT AND MOUNTING TABLE SYSTEM

CROSS-REFERENCE TO RELATED APPLICATIONS

This application claims priority to Japanese Patent Applications No. 2013-219281 filed on Oct. 22, 2013, the entire contents of which are incorporated herein by reference.

FIELD OF THE INVENTION

The present invention relates to a plasma processing apparatus, a power supply unit, and a mounting table system.

BACKGROUND OF THE INVENTION

When electronic devices are manufactured, various plasma treatments are performed on an object to be processed. In a plasma processing apparatus for performing plasma treatment, a plasma is generated by exciting a gas supplied into a processing chamber. The object to be processed is processed by the plasma thus generated.

In the plasma processing apparatus, the object to be processed is mounted on a mounting table. The mounting table includes a lower electrode and an electrostatic chuck. The electrostatic chuck is provided on the lower electrode. The lower electrode is electrically connected to a high frequency power supply for generating a high frequency power. Further, a heater for heating the object to be processed is provided in the electrostatic chuck. The heater is electrically connected to a heater power supply via a power feeder. The power feeder is coated by a coating portion made of an insulating material. Moreover, a filter unit is provided between the power feeder and the heater power supply. The filter unit has therein an LC filter. The filter unit can suppress flow of the high frequency power supplied to the lower electrode into the heater power supply. Such a plasma processing apparatus is disclosed in Japanese Patent Application Publication No. 2011-135052.

Meanwhile, there are various methods for exciting a processing gas. Recently, a plasma processing apparatus for exciting a processing gas by using a microwave attracts attention.

With respect to a microwave, the coating portion is a dielectric material. Therefore, in the plasma processing apparatus using a microwave, the microwave propagates through the coating portion. The leakage of the microwave may affect various components of the plasma processing apparatus. For example, the microwave may flow into the heater power supply or cause malfunction of various measurement devices.

SUMMARY OF THE INVENTION

In view of the above, the plasma processing apparatus for exciting a processing gas by using a microwave needs to suppress a microwave propagating through a component near the power feeder.

In accordance with an aspect of the present invention, there is provided a plasma processing apparatus for exciting a processing gas by using a microwave, including: a processing chamber; a mounting table provided in the processing chamber, the mounting table including a lower electrode and an electrostatic chuck disposed on the lower electrode; a high frequency power supply electrically connected to the lower electrode; a heater provided in the electrostatic chuck; a heater power supply configured to generate a power to be supplied to the heater; a filter unit including a filter connected to the heater power supply; a rod-shaped power feeder which connects the heater power supply and the heater via the filter; an insulating tubular portion having an inner hole through which the rod-shaped power feeder extends; and a conductive choke portion serving to suppress a microwave propagating through the insulating tubular portion, wherein the choke portion includes a first portion extending from the rod-shaped power feeder in a direction intersecting with a longitudinal direction of the power feeder and a cylindrical second portion extending, between the insulating tubular portion and the rod-shaped power feeder, from a peripheral portion of the first portion.

In an embodiment, the second portion has one end and the other end connected to the first portion. A distance between one end and the other end is about ¼ of the wavelength of the microwave in the atmosphere.

In the above plasma processing apparatus, the microwave propagating through the tubular portion, i.e., a part of the incident wave, propagates through a region between the second portion of the choke portion and the power feeder and then is reflected by the first portion. The reflection wave thus generated interferes with the incident wave, so that the incident wave is attenuated or cancelled. Accordingly, the plasma processing apparatus can suppress the microwave propagating through a component near the power feeder.

The plasma processing apparatus may further include a conductive surrounding portion provided along an outer periphery of the insulating tubular portion, and the filter unit may includes a conductive housing and the surrounding portion is separated from the housing.

The structure in which the tubular portion made of an insulating material is provided between the surrounding portion and the second portion of the choke portion may cause a capacitive component and decrease an impedance between the heater and the heater power supply. The decrease in the impedance can be controlled by separating the surrounding portion and the housing of the filter unit from each other.

The surrounding portion may include opposite ends having one end and the other end spaced further from the housing than the one end, and an insulation member may be provided between the one end of the surrounding portion and the housing. Further, the insulation member may be made of zirconium.

By providing the insulation member made of zirconium between the surrounding portion and the housing, it is possible to suppress the leakage of the microwave through the space between the surrounding portion and the housing.

In accordance with another aspect of the present invention, there is provided a power supply unit for connecting a heater provided in an electrostatic chuck and a heater power supply via a filter unit in a plasma processing apparatus for exciting a processing gas by using a microwave. The power supply unit includes the rod-shaped power feeder, the insulating tubular portion and the choke portion which are described above. The second portion of the choke portion may include opposite ends having one end and the other end connected to the first portion, and a distance between the one end and the other end may be about ¼ of a wavelength of the microwave in the atmosphere.

Such a power supply unit can suppress the microwave propagating through the component near the power feeder.

In accordance with still another aspect of the present invention, there is provided a mounting table system for use in a plasma processing apparatus for exciting a processing gas by using a microwave. The mounting table system includes: the mounting table, the high frequency power supply, the heater, the heater power supply, the filter unit the rod-shaped power feeder, the insulating tubular portion, and the choke portion, which are described above. Therefore, such a mounting table system can suppress the microwave propagating through the component near the power feeder.

In the mounting table system, the second portion of the choke portion may include opposite ends having one end and the other end connected to the first portion; and a distance between the one end and the other end may be about ¼ of a wavelength of the microwave in the atmosphere. In an embodiment, the mounting table system may further include a conductive surrounding portion provided along an outer periphery of the insulating tubular portion. In addition, the filter unit may include a conductive housing and the surrounding portion is separated from the housing. Furthermore, the surrounding portion may include opposite ends having one end and the other end spaced further from the housing than the one end; and an insulation member may be provided between the one end of the surrounding portion and the housing. The insulating member may be made of zirconium.

As described above, in the plasma processing apparatus for exciting a processing gas by a microwave, it is possible to suppress the microwave propagating through the component near the power feeder.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
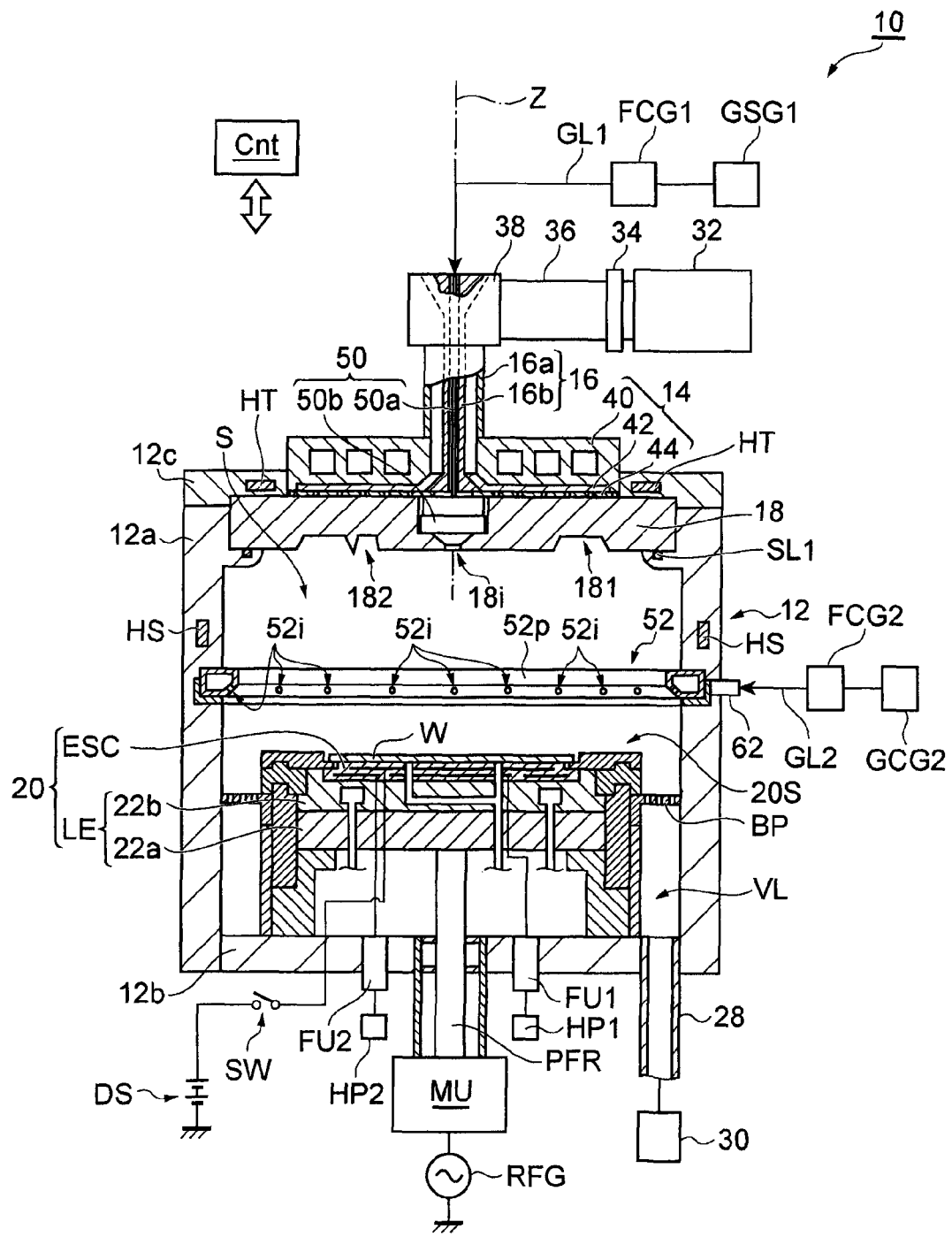
FIG. 1 schematically shows a plasma processing apparatus in accordance with an embodiment of the present invention.

Hereinafter, embodiments of the present invention will be described in detail with reference to the accompanying drawings. Further, like reference numerals will be used for like or corresponding parts throughout the drawings.

FIG. 1 schematically shows a plasma processing apparatus 10 in accordance with an embodiment of the present invention. In FIG. 1, a vertical cross section of the plasma processing apparatus is schematically illustrated. The plasma processing apparatus 10 shown in FIG. 1 generates a plasma by exciting a processing gas by using a microwave and processes an object to be processed (hereinafter, referred to as "wafer") W by using the plasma thus generated.

The plasma processing apparatus 10 includes a processing chamber 12. The processing chamber 12 has therein a processing space S. In the plasma processing apparatus 10, a wafer W is accommodated in the processing space S and subjected to plasma treatment. In the present embodiment, the processing chamber 12 includes a sidewall 12a, a bottom portion 12b and a ceiling portion 12c. The sidewall 12a has a substantially cylindrical shape extending in an extension direction of an axis Z (hereinafter, referred to as "axis Z direction"). The bottom portion 12b is provided at a lower end of the sidewall 12a. An upper end of the sidewall 12a is open. The opening formed at the upper end of the sidewall 12a is closed by a dielectric window. A dielectric window 18 is held between the upper end portion of the sidewall 12a and the ceiling portion 12c. A sealing member SL1 may be provided between the dielectric window 18 and the upper end portion of the sidewall 12a. The sealing member SL1 is, e.g., an O-ring, and contributes to airtight sealing of the processing chamber 12.

The plasma processing apparatus 10 further includes a mounting table system 20S. The mounting table system 20S includes a mounting table 20. In the processing chamber 12, the mounting table 20 is provided below the dielectric window 18. The mounting table 20 includes a lower electrode LE and an electrostatic chuck ESC. The lower electrode LE is connected to a high frequency power supply RFG via a matching unit MU. The high frequency power supply RFG generates a high frequency power (high frequency bias power) for ion attraction. The electrostatic chuck ESC is provided on the lower electrode LE. The wafer W is attracted and held on the electrostatic chuck ESC by Coulomb force. The mounting table 20 and its neighboring components will be described in detail later.

As shown in FIG. 1, the plasma processing apparatus 10 may further include heaters HT and HS. The heater HT is provided in the ceiling portion 12c and extends in an annular shape so as to surround an antenna 14. The heater HS is provided in the sidewall 12a and extends in an annular shape.

In the present embodiment, the plasma processing apparatus 10 may further include, in order to introduce a microwave into the processing chamber 12, the antenna 14, a coaxial waveguide 16, the dielectric window 18, a microwave generator 32, a tuner 34, a waveguide 36, and a mode transducer 38. The microwave generator 32 generates a microwave having a frequency of GHz level, e.g., 2.45 GHz. The microwave generator 32 is connected to an upper portion of the coaxial waveguide 16 via the tuner 34, the waveguide 36 and the mode transducer 38. The coaxial waveguide 16 extends along the axis Z. The center of a mounting region MR of the mounting table 20, i.e., the center of a region where the wafer W is mounted, is positioned on the axis Z.

The coaxial waveguide 16 includes an outer conductor 16a and an inner conductor 16b. The outer conductor 16a has a cylindrical shape extending in the axis Z direction. The central axis line of the outer conductor 16a substantially coincides with the axis Z. The lower end of the outer conductor 16a is electrically connected to the upper portion of a cooling jacket 40. The inner conductor 16b is disposed coaxially within the outer conductor 16a. In the present embodiment, the inner conductor 16b has a cylindrical shape extending in the axis Z direction. The lower end of the inner conductor 16b is connected to a slot plate 44 of the antenna 14.

In the present embodiment, the antenna 14 is a radial line slot antenna. The antenna 14 is disposed in the opening formed in the ceiling portion 12c and on the top surface of the dielectric window 18. The antenna 14 includes a dielectric plate 42 and the slot plate 44. The dielectric plate 42 shortens a wavelength of the microwave and has a substantially disc shape. The dielectric plate 42 is made of, e.g., quartz or alumina. The dielectric plate 42 is interposed between the slot plate 44 and the bottom surface of the cooling jacket 40. Therefore, the antenna 14 includes the dielectric plate 42, the slot plate 44 and the bottom surface of the cooling jacket 40.

Figure 2:
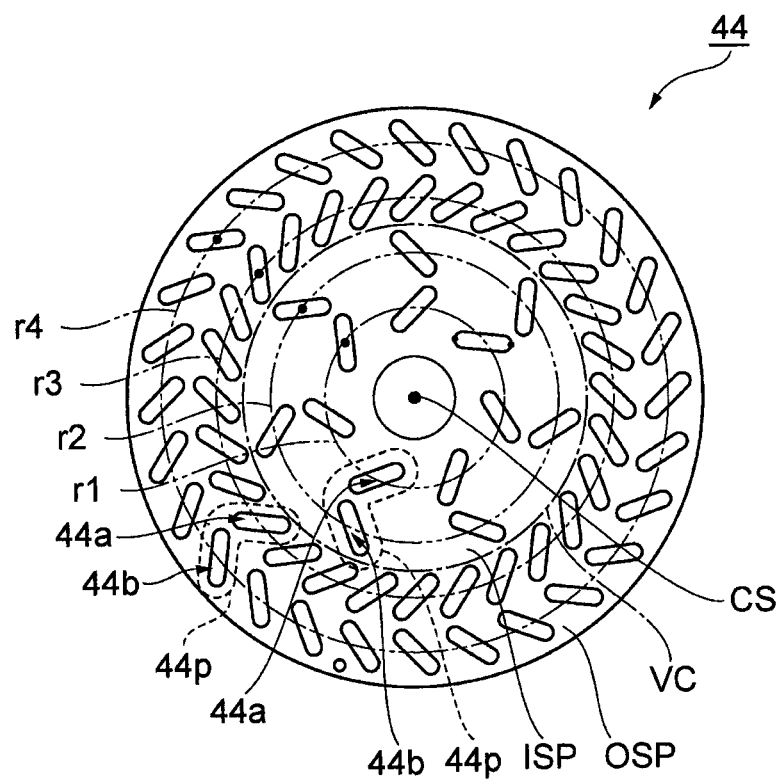
FIG. 2 is a top view showing an example of a slot plate.

FIG. 2 is a top view showing an example of the slot plate. The slot plate 44 is a disc-shaped thin plate. The slot plate 44 has flat opposite sides in a plate thickness direction. The center CS of the circular slot plate 44 is positioned on the axis Z. The slot plate 44 has multiple slot pairs 44p. Each slot pair 44p has two slot holes 44a and 44b formed through the slot plate 44 in the plate thickness direction. The slot holes 44a and 44b have an elongated hole shape when seen from the top. In each slot pair 44p, an extension direction of a long axis of the slot hole 44a intersects with or is perpendicular to an extension direction of a long axis of the slot hole 44b.

In the example shown in FIG. 2, the slot pairs 44p are divided into an inner slot pair group ISP disposed within a virtual circle VC centering about the axis Z and an outer slot pair group OPS disposed outside the virtual circle VC. The inner slot pair group ISP includes a plurality of slot pairs 44p. In the example shown in FIG. 2, the inner slot pair group ISP includes seven slot pairs 44p. The slot pairs 44p of the inner slot pair group ISP are arranged at a regular interval in a circumferential direction with respect to the center CS. The slot holes 44a included in the inner slot pair group ISP are arranged at a regular interval such that the centers of gravity of the slot holes 44a are positioned on a circle having a radius r1 from the center CS of the slot plate 44. Further, the slot holes 44b included in the inner slot pair group ISP are arranged at a regular interval such that the centers of gravity of the slot holes 44b are positioned on a circle having a radius r2 from the center CS of the slot plate 44. Here, the radius r2 is greater than the radius r1.

The outer slot pair group OSP includes a plurality of slot pairs 44p. In the example shown in FIG. 2, the outer slot pair group OSP includes 28 slot pairs 44p. The slot pairs 44p of the outer slot pair group OSP are arranged at a regular interval in a circumferential direction with respect to the center CS. The slot holes 44a included in the outer slot pair group OSP are arranged at a regular interval such that the centers of gravity of the slot holes 44a are positioned on a circle having a radius r3 from the center CS of the slot plate 44. Further, the slot holes 44b included in the outer slot pair group OSP are arranged at a regular interval such that the centers of gravity of the slot holes 44b are positioned on a circle having a radius r4 from the center CS of the slot plate 44. Here, the radius r4 is greater than the radius r3.

The slot holes 44a of the inner and the outer slot pair group ISP and OSP are formed in such a manner that the same angle is obtained between the long axis of each slot hole 44a and a segment connecting the center CS and the center of gravity of each slot hole 44a. The slot holes 44b of the inner and the outer slot pair group ISP and OSP are formed in such a manner that the same angle is obtained between the long axis of each slot hole 44b and a segment connecting the center CS and the center of gravity of each slot hole 44b.

Figure 3:
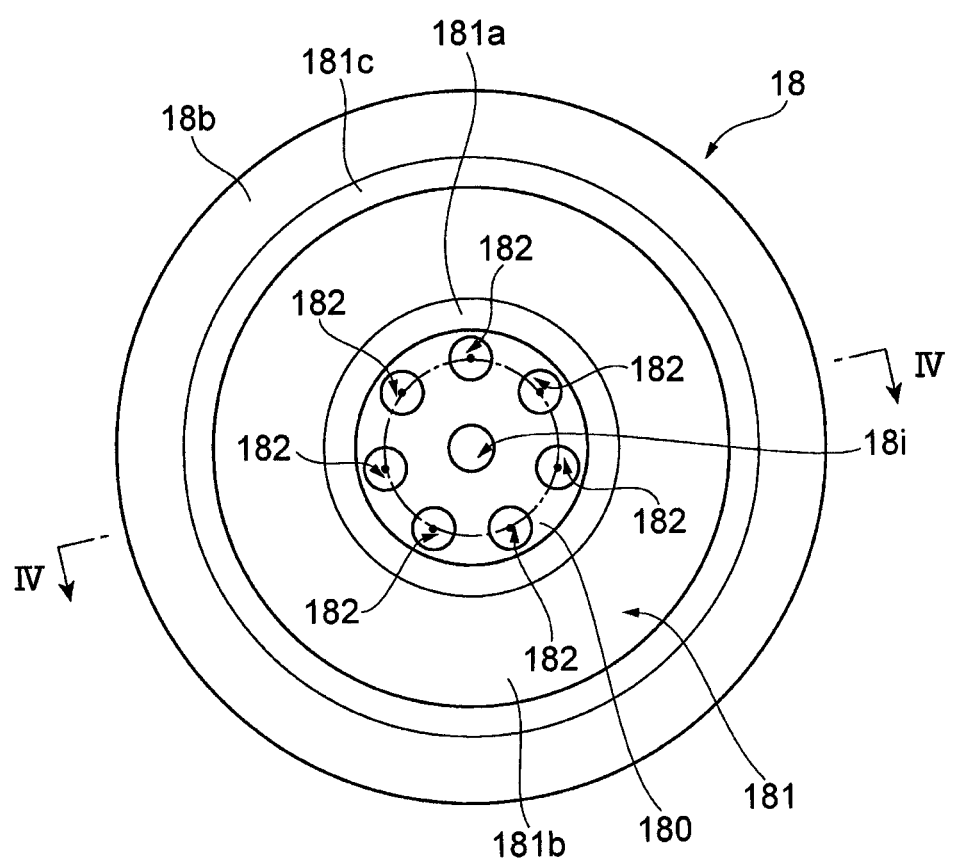
FIG. 3 is a top view showing an example of a dielectric window.
Figure 4:
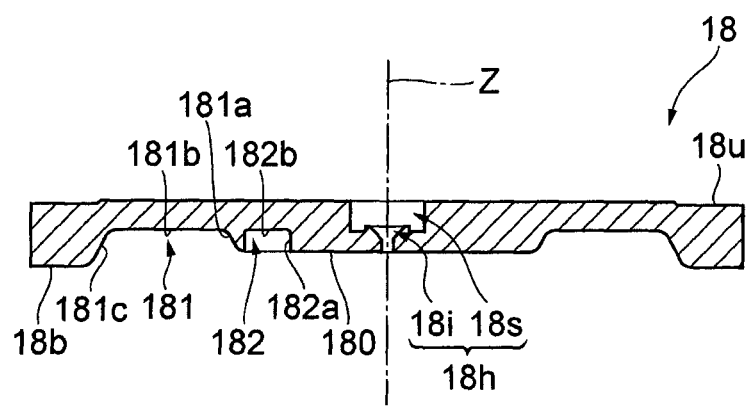
FIG. 4 is a cross sectional view taken along line IV-IV shown in FIG. 3.

FIG. 3 is a top view showing an example of the dielectric window and illustrates a state in which the dielectric window is seen from the processing space S side. FIG. 4 is a cross sectional view taken along line IV-IV shown in FIG. 3. The dielectric window 18 has a substantially disc shape and is made of a dielectric material such as alumina, quartz or the like. The slot plate 44 is provided on a top surface 18u of the dielectric window 18.

A through hole 18h is formed at the center of the dielectric window 18. An upper portion of the through hole 18h serves as a space 18s accommodating an injector 50b of a central introduction unit 50 which will be described later. A lower portion of the through hole 18h serves as a central introduction port 18i of the central introduction unit 50 which will be described later. Further, the central axis line of the dielectric window 18 coincides with the axis Z.

A surface opposite to the top surface 18u of the dielectric window, i.e., a bottom surface 18b, is in contact with the processing space S where plasma is generated. The bottom surface 18b has various shape. Specifically, the bottom surface 18b has a flat surface 180 at a central region surrounding the central introduction port 18i. The flat surface 180 is perpendicular to the axis Z. The bottom surface 18b further has a first recess 181 that extends in an annular shape in a diametrically outer region of the bottom surface 180 and is recessed inwardly in a tapered shape in the plate thickness direction of the dielectric window 18.

The first recess 181 is defined by an inner tapered surface 181a, a bottom surface 181b, and an outer tapered surface 181c. The bottom surface 181b is close to the top surface 18u compared to the flat surface 180 and extends in an annular shape in parallel to the flat surface 180. The inner tapered surface 181a extends in an annular shape between the flat surface 180 and the bottom surface 181b and is inclined with respect to the flat surface 180. The outer tapered surface 181c extends in an annular shape between the bottom surface 181b and a peripheral portion of the bottom surface 18b and is inclined with respect to the bottom surface 181b. Further, the peripheral region of the bottom surface 18b is in contact with the sidewall 12a.

The bottom surface 18b has a plurality of second recesses 182 that are recessed inwardly in the plate thickness direction from the flat surface 180. Seven recesses 182 are formed in the example shown in FIGS. 3 and 4. The second recesses 182 are formed at a regular interval along the circumferential direction. Further, the second recesses 182 have a circular planar shape on a surface perpendicular to the axis Z. Specifically, an inner surface 182a forming the second recess 182 is a cylindrical surface extending in the axis Z direction. Further, a bottom surface 182b of the second recess 182 is a circular surface that is in parallel to the flat surface 180 and close to the top surface 18u compared to the flat surface 180.

Figure 5:
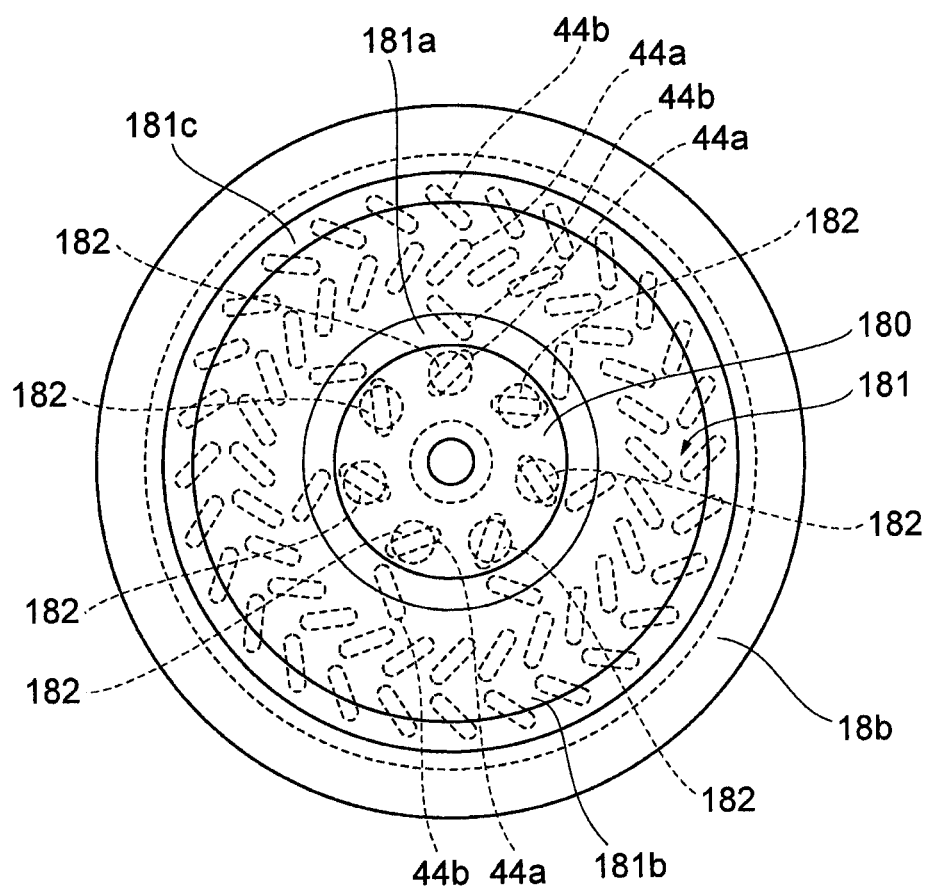
FIG. 5 is a top view showing a state in which the slot plate shown in FIG. 2 is provided on the dielectric window shown in FIG. 3.

FIG. 5 is a top view showing a state in which the slot plate shown in FIG. 2 is provided on the dielectric window shown in FIG. 3 and illustrates the dielectric window 18 seen from the bottom. As shown in FIG. 5, in a plan view, i.e., when seen in the axis Z direction, the slot holes 44a and 44b of the outer slot pair group OSP and the slot holes 44b of the inner slot pair group ISP are overlapped with the first recess 181. Specifically, in a plan view, parts of the slot holes 44 of the outer slot pair group OSP are partially overlapped with the outer tapered surface 181c and other parts of the slot holes 44 are overlapped with the bottom surface 181b. In a plan view, the slot holes 44a of the outer slot pair group OSP are overlapped with the bottom surface 181b. When seen from the top, parts of the slot holes 44b of the inner slot pair group ISP are overlapped with the inner tapered surface 181a and other parts of the slot holes 44b are overlapped with the bottom surface 181b.

In a plan view, i.e., when seen in the axis Z direction, the slot holes 44a of the inner slot pair group ISP are overlapped with the second recess 182. Specifically, in a plan view, the centers of gravity (the centers) of the bottom surfaces of the second recesses 182 are positioned within the slot holes 4a of the inner slot pair group ISP.

FIG. 1 will be referred to again. In the plasma processing apparatus 10, the microwave generated by the microwave generator 32 propagates toward the dielectric plate 42 through the coaxial waveguide 16 and then reaches the dielectric window 18 through the slot holes 44a and 44b of the slot plate 44.

In the dielectric window 18, the plate thickness of the first recess 181 and the plate thickness of the second recess 182 are smaller than the plate thickness of the other portions, as described above. Therefore, in the dielectric window 18, the portions where the first and the second recess 181 and 182 are formed have high microwave transmission properties. Further, when seen in the axis Z direction, the slot holes 44a and 44b of the outer slot pair group OSP and the slot holes 44b of the inner slot pair group ISP are overlapped with the first recess 181, and the slot holes 44a of the inner slot pair group ISP are overlapped with the second recess 182. Therefore, an electric field of the microwave is concentrated at the first and the second recess 181 and 182 and, thus, the energy of the microwave is concentrated at the first and the second recess 181 and 182. As a result, the plasma can be stably generated at the first and the second recess 181 and 182 and it is possible to stably generate the plasma distributed in the diametrical and the circumferential direction directly below the dielectric window 18.

The plasma processing apparatus 10 includes the central introduction unit 50 and a peripheral inlet unit 52. The central introduction unit 50 has a conduit 50a, the injector 50b, and the central introduction port 18i. The conduit 50a extends through the inner hole of the inner conductor 16b of the coaxial waveguide 16. Further, an end portion of the conduit 50a extends into the space 18s (see FIG. 4) formed at the dielectric window 18 along the axis Z. The injector 50b is accommodated inside the space 18s and below the end portion of the conduit 50a. The injector 50b has a plurality of through holes extending in the axis Z direction. Further, the dielectric window 18 has the central introduction port 18i. The central introduction port 18i extends downward from the space 18s along the axis Z. The central introduction unit 50 configured as described above supplies a gas into the injector 50b through the conduit 50a, and the gas is injected from the injector 50b through the central introduction port 18i. In this manner, the central introduction unit 50 allows the gas to be injected to the space immediately below the dielectric window 18 along the axis Z. In other words, the central introduction unit 50 introduces the gas into a plasma generation region where an electron temperature is high.

The peripheral inlet unit 52 has a plurality of peripheral inlet ports 52i. The gas is supplied to the edge region of the wafer W through the peripheral inlet ports 52i. The peripheral inlet ports 52i open toward the edge region of the wafer W or the circumference of the mounting region MR. The peripheral inlet ports 52i are arranged along the circumferential direction below the central introduction port 18i and above the mounting table 20. In other words, the peripheral inlet ports 52i are arranged in an annular shape about the axis Z in a region directly below the dielectric window where the electron temperature is low (plasma diffusion region). The peripheral inlet unit 52 supplies a gas from the low electron temperature region toward the wafer W. Therefore, the dissociation degree of the gas introduced into the processing space S from the peripheral inlet unit 52 is lower than that of the gas supplied to the processing space S from the central introduction unit 50.

A first gas source group GSG1 is connected to the central introduction unit 50 via a first flow rate control unit group FCG1. Further, a second gas source group GSG2 is connected to the peripheral inlet unit 52 via a second flow rate control unit group FCG2. The first gas source group GSG1 includes a plurality of first gas sources, and the first flow rate control unit group FCG1 includes a plurality of first flow rate control units. The first gas sources are connected to a common gas line GL1 via the first flow rate control units. The common gas line GL1 is connected to the central introduction unit 50. Further, each of the first flow rate control units includes, e.g., two valves, and a flow rate controller disposed between the two valves. The flow rate controller is, e.g., a mass flow controller.

The second gas source group GSG2 includes a plurality of second gas sources, and the second flow rate control unit group FCG2 includes a plurality of second flow rate control units. The second gas sources are connected to a common gas line GL2 via the second flow rate control units. The common gas line GL2 is connected to the peripheral inlet unit 52. Further, each of the second flow rate control units includes, e.g., two valves and a flow rate controller disposed between the two valves. The flow rate controller is, e.g., a mass flow controller.

As described above, in the plasma processing apparatus 10, the first gas sources and the first flow rate control units are provided only for the central introduction unit 50, and the second gas sources and the second flow rate control units which are independent from the first gas sources and the first flow rate control units are provided only for the peripheral inlet unit 52. Therefore, types and flow rates of one or more gases contained in the processing gas introduced from the central introduction unit 50 into the processing space S can be independently controlled. Further, types and flow rates of one or more gases contained in the processing gas introduced from the peripheral inlet unit 52 into the processing space S can be independently controlled.

In the present embodiment, the plasma processing apparatus 10 may further include a controller Cnt as shown in FIG. 1. The controller Cnt may be a control device such as a programmable computer device or the like. The controller Cnt can control the components of the plasma processing apparatus 10 in accordance with a program based on a recipe. For example, the controller Cnt can control types and flow rates of gases supplied to the central introduction unit 50 by transmitting control signals to the flow rate control units of the first flow rate control unit group FCG1. Further, the controller Cnt can control types and flow rates the gases supplied to the peripheral inlet unit 52 by transmitting control signals to the flow rate control units of the second flow rate control unit group FCG2. In addition, the controller Cnt can control a microwave power, a power level and an ON/OFF state of the RF power, and a pressure in the processing chamber 12 by transmitting control signals to the microwave generator 32, the high frequency power supply RFG, and the gas exhaust unit 30.

In the present embodiment, the peripheral inlet unit 52 further includes an annular line 52p. The annular line 52p has a plurality of peripheral inlet ports 52i. The annular line 52p may be made of, e.g., quartz. In the present embodiment, the annular line 52p is disposed along an inner wall surface of the sidewall 12a as shown in FIG. 1. In other words, the annular line 52p is not disposed on a path that connects the bottom surface of the dielectric window 18 and the mounting region MR, i.e., the wafer W. Accordingly, the annular line 52p does not disturb diffusion of the plasma. Since the annular line 52p is disposed along the inner wall surface of the sidewall 12a, the wear of the annular line 52p due to the plasma is suppressed, and the exchange frequency of the annular line 52p can be reduced. Further, the annular line 52p is provided along the sidewall 12a whose temperature can be controlled by the heater, so that the stability of the temperature of the gas introduced from the peripheral inlet unit 52 into the processing space S can be improved.

In the present embodiment, the peripheral inlet ports 52i open toward the edge region of the wafer W. In other words, the peripheral inlet ports 52i are inclined with respect to a plane perpendicular to the axis Z so that the gas can be injected toward the edge region of the wafer W. Since the peripheral inlet ports 52i are inclined toward the edge region of the wafer W, active species of the gas injected from the peripheral inlet ports 52i are directly directed toward the edge region of the wafer W. Accordingly, it is possible to supply the active species of the gas to the edge region of the wafer W without inactivating them. As a result, a difference in processing rates of the respective regions in the diametrical direction of the wafer W can be reduced.

Figure 6:
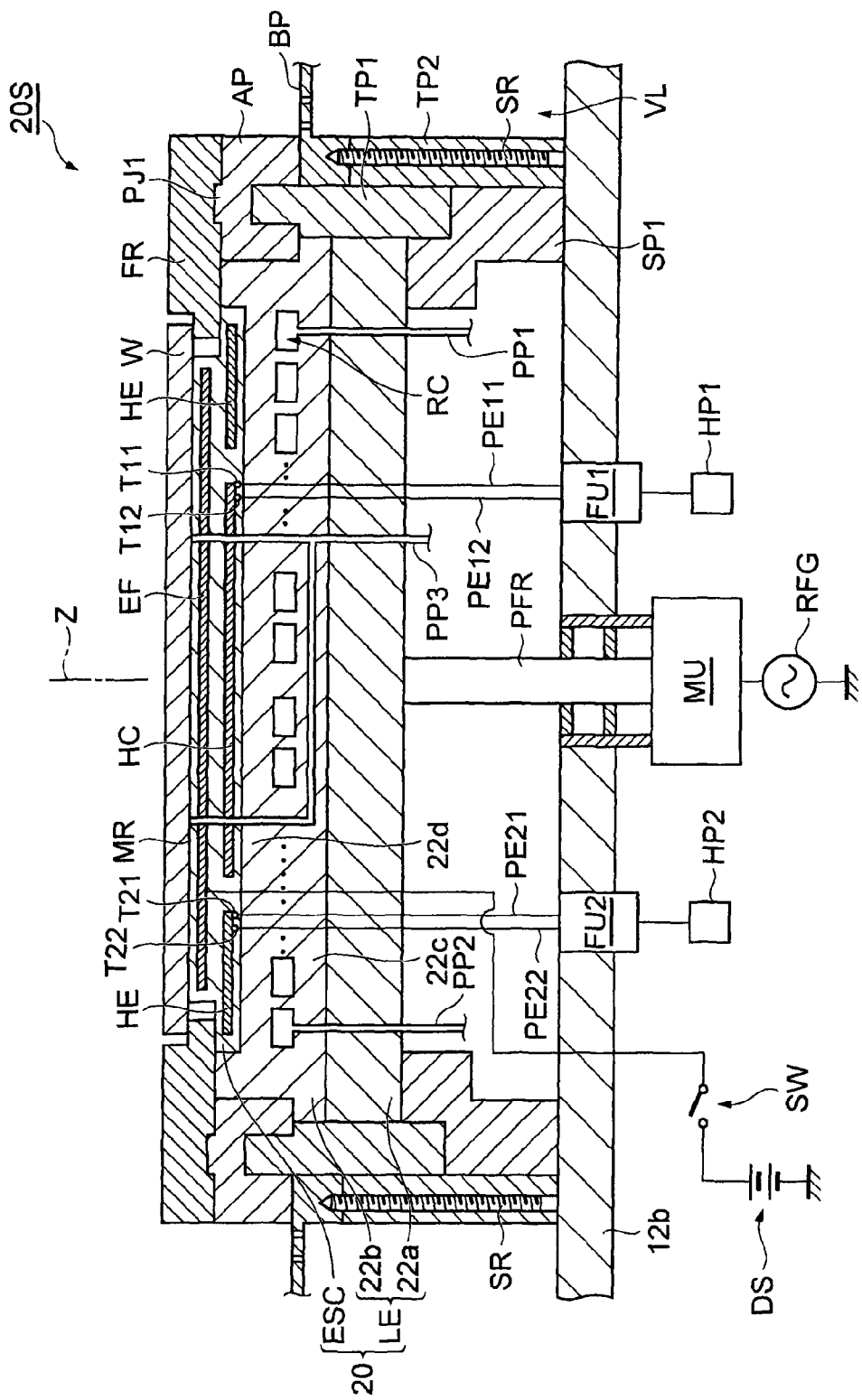
FIG. 6 is an enlarged view of a mounting table system of the plasma processing apparatus shown in FIG. 1.
Figure 7:
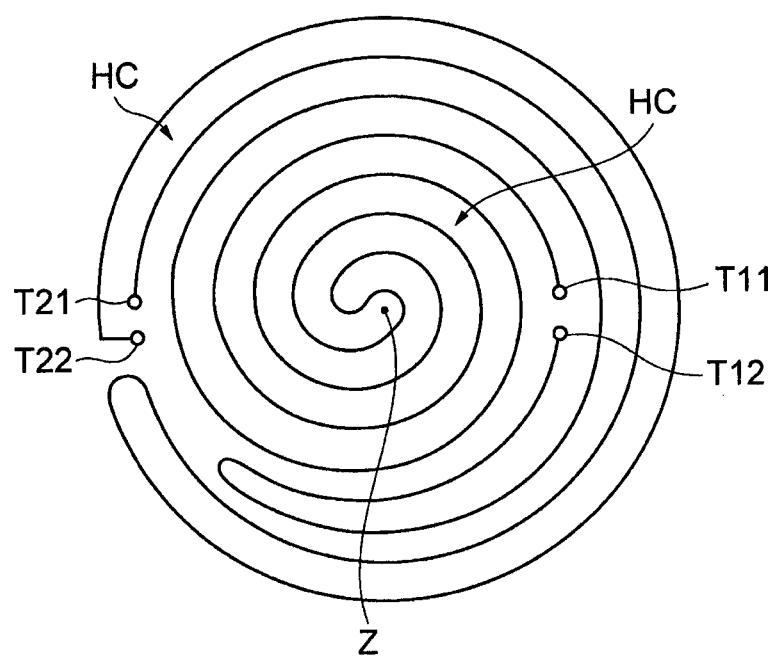
FIG. 7 is a top view showing heaters in an electrostatic chuck.

Hereinafter, the mounting table of the plasma processing apparatus 10 and its neighboring components will be described in detail with reference to FIGS. 1, 6 and 7. FIG. 6 is an enlarged view of the mounting table of the plasma processing apparatus shown in FIG. 1 and its neighboring components. FIG. 7 is an enlarged view of a part of the configuration shown in FIG. 6. As described above, the mounting table 20 includes the lower electrode LE and the electrostatic chuck ESC.

In the present embodiment, the lower electrode LE has a first plate 22a and a second plate 22b. The first plate 22a is a substantially disc-shaped member. Further, the first plate 22a is a conductive member made of, e.g., aluminum. The central axis line of the first plate 22a substantially coincides with the axis Z. The first plate 22a is supported by a substantially cylindrical support SP1. The support SP1 extends upward from the bottom portion 12b and is brought into contact with the peripheral portion of the bottom surface of the first plate 22a. The support SP1 is made of an insulating material such as quartz or the like.

The second plate 22b is provided on the first plate 22a. The second plate 22b is a substantially disc-shaped member. Further, the second plate 22b is a conductive member made of, e.g., aluminum. The second plate 22b is electrically connected to the first plate 22a. The central axis line of the second plate 22b substantially coincides with the axis Z. In the present embodiment, the second plate 22b has a large diameter portion 22c and a small diameter portion 22d. The large diameter portion 22c is disposed below the small diameter portion 22d and continued from the small diameter portion 22d. The diameter of the large diameter portion 22c is greater than that of the small diameter portion 22d and substantially equal to that of the first plate 22a.

The high frequency power supply RFG is electrically connected to the first plate 22a via a power feed rod PFR and a matching unit MU. The high frequency power supply RFG outputs a high frequency bias power having a frequency suitable for controlling energy of ions attracted to the wafer W, e.g., 13.65 MHz. The matching unit MU accommodates a matcher for matching an impedance of the high frequency power supply RFG side and an impedance of a load side that is mainly the electrode, the plasma, the processing chamber 12 or the like. The matcher has therein a blocking capacitor for self-bias generation.

The second plate 22b has therein a coolant channel RC. The coolant channel RC extends in a spiral shape around the axis Z. A coolant, e.g., cooling water, having a predetermined temperature is supplied into the coolant channel RC from a chiller unit through pipes PP1 and PP2 and circulated therein. The temperature of the wafer W on the electrostatic chuck ESC can be controlled by the circulating coolant. Further, a heat transfer gas, e.g., He gas, from a heat transfer gas supply unit is supplied to a gap between the top surface of the electrostatic chuck ESC and the backside of the wafer W through a pipe PP3.

The electrostatic chuck ESC is provided on the top surface of the second plate 22b. The electrostatic chuck ESC has a substantially disc shape, and the central axis line thereof substantially coincides with the axis Z. The top surface of the electrostatic chuck ESC serves as a mounting region MR on which the wafer W is mounted. The mounting region MR has a substantially circular shape, and the center thereof is substantially positioned on the axis Z. The electrostatic chuck ESC holds the wafer W thereon by electrostatic attraction force. To do so, the electrostatic chuck ESC includes an electrode film EF provided in a dielectric film. A DC power supply DC is electrically connected to the electrode film EF via a switch SW. The wafer W can be attracted and held on the top surface of the electrostatic chuck ESC by Coulomb force generated by a DC voltage applied from the DC power supply DS.

In addition, a focus ring FR is provided at a diametrically outer side of the electrostatic chuck ESC. The focus ring FR extends in an annular shape along the edge of the electrostatic chuck ESC and the edge of the wafer W so as to surround the electrostatic chuck ESC. The focus ring FR is made of a dielectric material such as quartz or the like. The focus ring FR controls a sheath potential at the outer side of the edge of the wafer W and contributes to in-plane uniformity of the plasma processing of the wafer W.

A first tubular member TP1 is provided below the focus ring FR. The first tubular member TP1 is made of at insulating material such as alumina or the like. The first tubular member TP1 has a cylindrical shape and extends along the outer peripheral surface of the lower electrode LE. In the present embodiment, the first tubular member TP1 extends along the outer peripheral surface of the upper portion of the support SP1, the outer peripheral surface of the first plate 22a and the outer peripheral surface of the large diameter portion 22c of the second plate 22b.

An annular member AP is provided between the first tubular member TP1 and the focus ring FR. The annular member AP is made of a dielectric material such as alumina or the like. The annular member AP extends in an annular shape along the outer peripheral surface of the small diameter portion 22d of the second plate 22b. The top surface of the annular member AP is in contact with the bottom surface of the focus ring FR. In the present embodiment, the top surface of the annular member AP includes an upwardly protruding protrusion PJ1. The protrusion PJ1 extends in an annular shape between the inner periphery and the outer periphery of the top surface of the annular member AP. Meanwhile, the bottom surface of the focus ring FR has a recess to be engaged with the protrusion PJ1. Accordingly, when the focus ring FR is mounted on the annular member AP, the position of the focus ring FR is determined.

A recess is formed at the bottom surface of the annular member AP. The recess extends in an annular shape between the inner periphery and the outer periphery of the bottom surface of the annular member AP. The recess is engaged with the upper end portion of the first tubular member TP1. Further, the bottom surface of the annular member AP is in contact with, at an inner side of the recess, a stepped surface between the large diameter portion 22c and the small diameter portion 22d of the second plate 22b and the first tubular member TP1.

A second tubular member TP2 is formed below the region RL2 and the recess formed in the annular member AP. The second tubular member TP2 substantially has a cylindrical shape. The second tubular member TP2 extends along the outer peripheral of the first tubular member TP1. In the present embodiment, the second tubular member TP2 is in contact with a region between the lower end and an intermediate portion in the axis Z direction of the outer peripheral surface of the first tubular member TP1. The second tubular member TP2 is also in contact with the outer peripheral surface of the lower portion of the support SP1. The second tubular member TP2 is made of a conductive material, e.g., aluminum. In the present embodiment, a film made of $Y_2O_3$ may be formed on the surface of the second tubular member TP2. Or, the surface of the second tubular member TP2 may be oxidized.

A gas exhaust passage VL is formed between the sidewall 12a and the outer peripheral surface of the second tubular member TP2 and the outer peripheral surface of the annular member AP. The gas exhaust passage VL extends to the bottom portion 12b and is connected to a gas exhaust line 28 provided at the bottom portion 12b. A gas exhaust unit 30 is connected to the gas exhaust line 28. The gas exhaust unit 30 includes a pressure control unit and a vacuum pump such as a turbo molecular pump or the like. By operating the gas exhaust unit 30, a gas can be exhausted from the outer periphery of the mounting table 20 through the gas exhaust passage VL and a pressure in the processing space S in the processing chamber 12 can be decreased to a desired vacuum level.

A baffle plate BP is provided at an intermediate portion in the axis Z direction of the gas exhaust passage VL. The baffle plate BP is a plate-shaped member extending in an annular shape about the axis Z. The baffle plate BP has a plurality of through holes. The through holes penetrate through the baffle plate BL in the axis Z direction. An inner edge portion IEP of the baffle plate BP is provided between the second tubular member TP2 and the annular member AP.

A screw hole extending in the axis Z direction is formed at the inner peripheral portion of the baffle plate BP and the second tubular member TP2. By inserting a screw SR into the screw hole, the baffle plate BP is fixed to the second tubular member TP2.

Further, heaters HC and HE are provided inside the dielectric film of the electrostatic chuck ESC. FIG. 7 is a top view showing the heaters inside the electrostatic chuck. As shown in FIG. 7, the heaters HC and HE are formed of, e.g., heating wire. The heater HC includes terminals T11 and T12. The heater HC extends so as to revolve about the axis Z. The heater HE includes terminals T21 and T22. The heater HE extends, at an outer side of the heater HE, so as to revolve about the axis Z.

As shown in FIGS. 6 and 7, the heater HC is provided below the electrode film EF and below the central portion of the mounting region MR, i.e., in a region intersecting with the axis Z. The heater HE is provided below the electrode film EF and extends so as to surround the heater HC. The heater HE is provided below the edge region of the mounting region MR.

A heater power supply HP1 is connected to the heater HC via a filter unit all. The heater power supply HP1 supplies an AC power to the heater HC. The filter unit FU1 suppresses the high frequency power flowing from the high frequency power supply RFG to the heater power supply HP1. The filter unit FU1 is formed as, e.g., an LC filter. Further, a heater power supply HP2 is connected to the heater HE via a filter unit FU2. The heater power supply HP2 supplies an AC power to the heater HE. The filter unit FU2 suppresses the high frequency power flowing from the high frequency power supply RFG to the heater power supply HP2. The filter unit FU2 is formed as, e.g., an LC filter. The filter units FU1 and FU2 suppress the flow of the high frequency power from the high frequency power supply RFG to the heater power supply and the consumption thereof.

Figure 8:
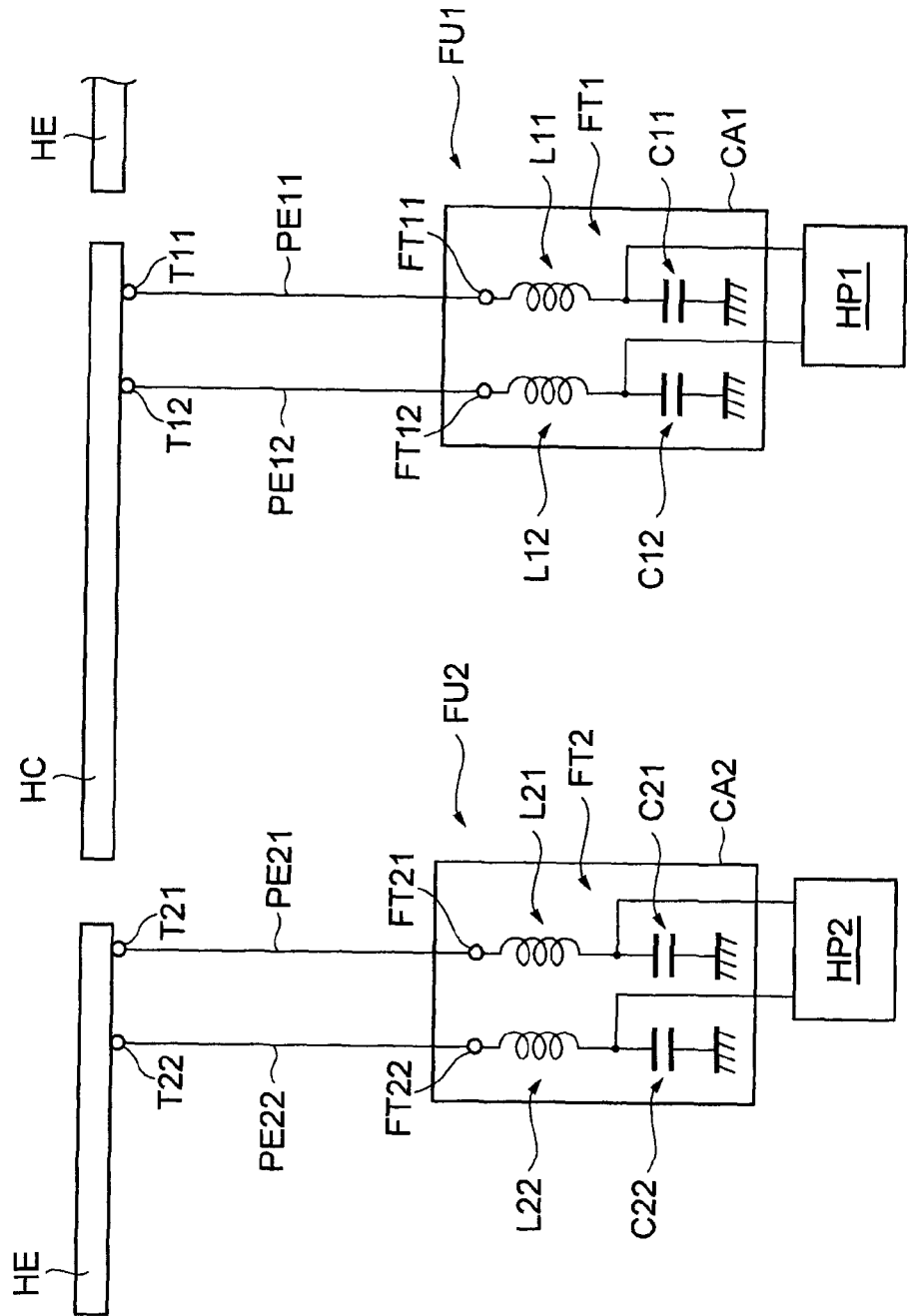
FIG. 8 shows specific configurations of filter units and electrical connection between the heaters and heater power supplies.

Hereinafter, the specific configuration of the filter unit and the electrical connection between the heater power supply and the heater will be described in detail. FIG. 8 illustrates the specific configuration of the filter unit and the electrical connection between the heater power supply and the heater. As shown in FIG. 8, the filter unit FU1 is connected to the heater power supply HP1. The filter unit FU1 includes a conductive housing CA1 and a filter FT1 installed in the housing CA1. The housing CA1 is frame grounded. The filter FT1 has inductors L11 and L12 and capacitors C11 and C12. The inductor L11 and the capacitor C11 are provided between a first output terminal of the heater power supply HP1 and a first terminal FT11 of the filter FT1. Specifically, one end of the inductor L11 is connected to the first terminal FT11 and the other end of the inductor L11 is connected to one end of the capacitor C11. The other end of the capacitor C11 is connected to a ground potential. Further, a wiring extending from a node between the inductor L11 and the capacitor C11 is connected to the first output terminal of the heater power supply HP1.

The inductor L12 and the capacitor C12 are provided between a second output terminal of the heater power supply HP1 and a second terminal FT12 of the filter FT1. One end of the inductor L12 is connected to the second terminal FT12 and the other end of the inductor L12 is connected to one end of the capacitor C12. The other end of the capacitor C12 is connected to a ground potential. Further, a wiring extending from a node between the inductor L12 and the capacitor C12 is connected to the second output terminal of the heater power supply HP1.

The filter FT1 and the heater HC are connected to each other by a pair of power feeders PE11 and PE12. Specifically, one end of the power feeder PE11 is connected to the terminal T11 of the heater HC and the other end of the power feeder PE11 is connected to the first terminal FT11 of the filter FT1. Further, one end of the power feeder PE12 is connected to the terminal T12 of the heater HC and the other end of the power feeder PE12 is connected to the second terminal of the filter FT1.

The filter unit FU2 has the same configuration as that of the filter unit Fn. Further, the electrical connection between the heater power supply HP2 and the heater HE is the same as that between the heater power supply HP1 and the heater HC.

Specifically, the filter unit FU2 includes a conductive housing CA2 and a filter FT2 installed in the housing CA2. The housing CA2 is frame grounded. The filter FT2 includes inductors L21 and L22 and capacitors C21 and C22. The inductor L21 and the capacitor C21 are provided between a first output terminal of the heater power supply HP2 and a first terminal FT21 of the filter FT2. One end of the inductor L21 is connected to the first terminal FT21 and the other end of the inductor L21 is connected to one end of the capacitor C21. The other end of the capacitor C21 is connected to a ground potential. Further, a wiring extending from a node between the inductor L21 and the capacitor C21 is connected to the first output terminal of the heater power supply HP2.

The inductor L22 and the capacitor C22 are provided between a second output terminal of the heater power supply HP2 and a second terminal FT22 of the filter FT2. One end of the inductor L22 is connected to the second terminal FT22 and the other end of the inductor L22 is connected to one end of the capacitor C22. The other end of the capacitor C22 is connected to a ground potential. Further, a wiring extending from a node between the inductor L22 and the capacitor C22 is connected to the second output terminal of the heater power supply HP2.

The filter FT2 and the heater HE are connected to each other by a pair of power feeders PE21 and PE22. One end of the power feeder PE21 is connected to the terminal T21 of the heater HE and the other end of the power feeder PE21 is connected to the first terminal FT21 of the filter FT2. Further, one end of the power feeder PE22 is connected to the terminal T22 of the heater HE and the other end of the power feeder PE22 is connected to the second terminal FT22 of the filter FT2.

A structure for suppressing a microwave propagating through a component near the pair of power feeders PE11 and PE12 is provided near the pair of power feeders PE11 and PE12. In the same manner, a structure for suppressing a microwave propagating through a component near the pair of power feeders PE21 and PE22 is provided near the power feeders PE21 and PE22. A power supply unit including the pair of power feeders PE11 and PE12 and the structure for suppressing a microwave near the power feeders PE11 and PE12 has the same configuration as that of a power supply unit including the pair of power feeders PE21 and PE22 and the structure for suppressing a microwave near the power feeders PE21 and PE22. Although the configuration of the power supply unit PU including the power feeders PE11 and PE12 will be described hereinafter, such a configuration may be employed for power supply unit including the pair of power feeders PE21 and PE22.

Figure 9:
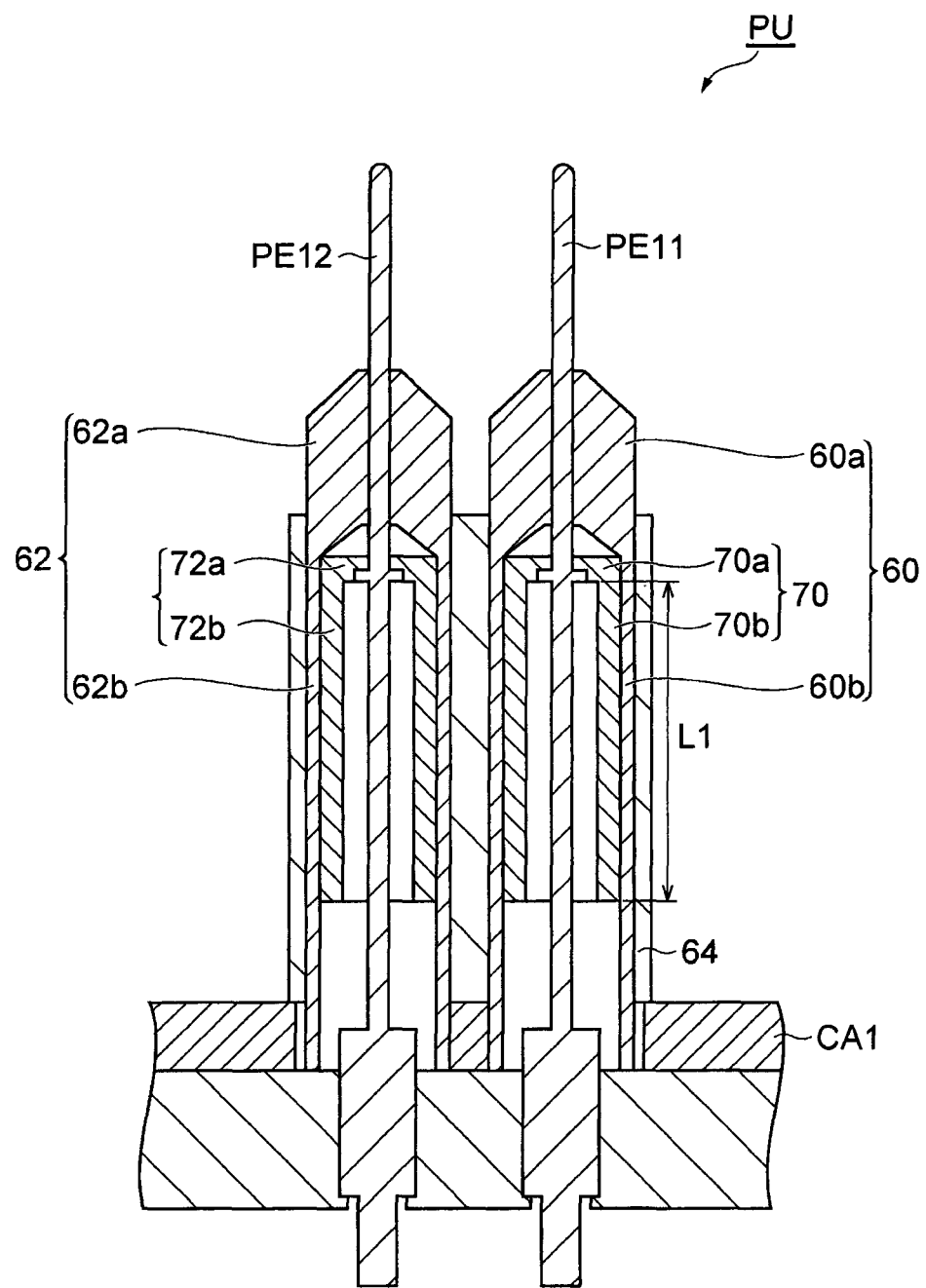
FIG. 9 shows a power supply unit in accordance with an embodiment of the present invention.

FIG. 9 shows a power supply unit in accordance with an embodiment of the present invention. In FIG. 9, there is illustrated a longitudinal cross section of a pair of power feeders. The power supply unit PU shown in FIG. 9 includes the pair of power feeders PE11 and PE12. The power feeders PE11 and PE12 are rod-shaped conductors. The power feeder PE11 is surrounded by a tubular portion 60 except for one end (lower end portion) and the other end (upper end portion) thereof. The tubular portion 60 has a substantially cylindrical shape. Further, the tubular portion 60 is made of an insulating material such as alumina or the like. The power feeder PE11 penetrates through an inner hole of the tubular portion 60.

In the present embodiment, the tubular portion 60 includes an upper portion 60a and a lower portion 60b. A diameter of the inner hole of the upper portion 60a is substantially equal to that of the power feeder PE11. The lower portion 60b is continued from the upper portion 60a. A diameter of an inner hole of the lower portion 60b is greater than that of the upper portion 60a. An inner surface of the lower portion 60b is separated from the outer peripheral surface of the power feeder PE11.

The tubular portion 60 is surrounded by a surrounding portion 64. The surrounding portion 64 has a through hole through which the tubular portion 60 passes, and the tubular portion 60 extends through the through hole. The surrounding portion 64 extends along the outer peripheral surface of the tubular portion 60 while being in contact therewith. The surrounding portion 64 is made of a conductive material such as aluminum or the like.

A choke portion 70 is accommodated in the inner hole of the lower portion 60b of the tubular portion 60. The choke portion 70 has a function of suppressing a microwave propagating through the tubular portion 60. The choke portion 70 is made of a conductive material and includes a first portion 70a and a second portion 70b. The first portion 70a extends from the outer peripheral surface of the power feeder PE11 in a direction intersecting with the longitudinal direction of the power feeder PE11. For example, the first portion 70a has a disc shape having a through hole at a center thereof. The inner periphery of the first portion 70a defining the through hole is formed is in contact with the power feeder PE11.

The second portion 70b has a cylindrical shape. The second portion 70b extends downward, between the tubular portion 60 and the power feeder PE11, from the peripheral portion of the first portion 70a. The outer peripheral surface of the second portion 70b is in contact with the inner surface of the lower portion 60b of the tubular portion 60. Further, the inner surface of the second portion 70b is separated from the outer peripheral surface of the power feeder PE11. The second portion 70b has a length that is about ¼ of the wavelength of the microwave in the atmosphere. Specifically, the second portion 70b includes one end (lower end) and the other end connected to the first portion 70a, a distance between the one end and the other end is about ¼ of the wavelength of the microwave in the atmosphere.

Figure 10:
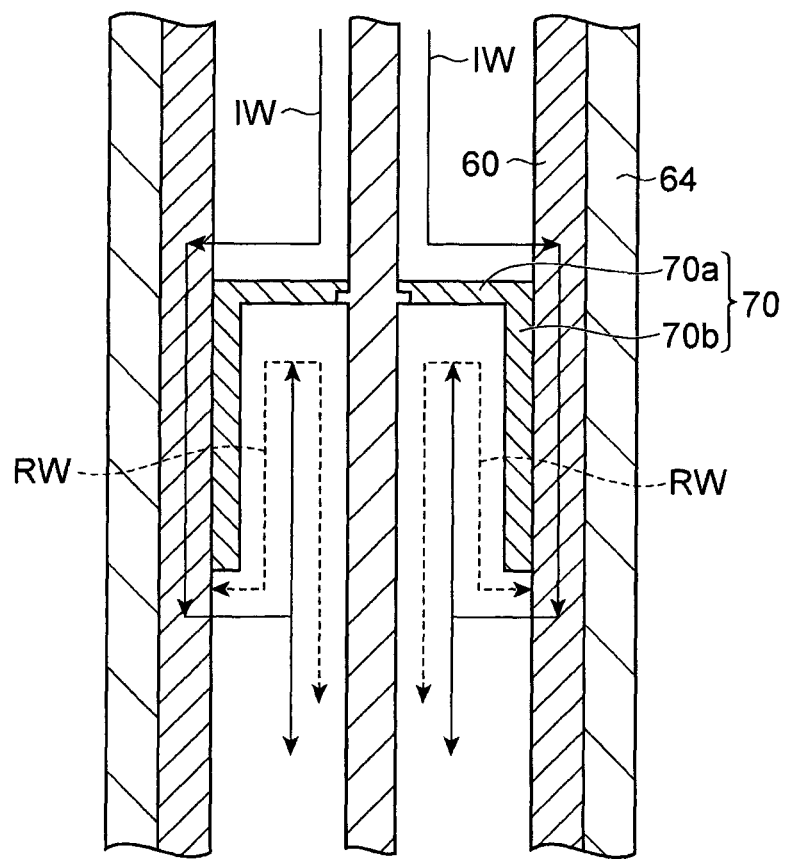
FIG. 10 explains principle of suppressing a microwave by using a choke portion.

FIG. 10 explains principle of suppressing a microwave by using the choke portion 70. In FIG. 10, solid arrows indicate a microwave, i.e., an incident wave IW, propagating through the tubular portion 60, and dashed arrows indicate a reflection wave RW reflected by the choke portion 70. As shown in FIG. 10, the incident wave IW propagating through the tubular portion 60 is moved toward a cavity between the power feeder PE11 and the second portion 70b of the choke portion 70 and then toward first portion 70a. In the first portion 70a, the incident wave IW is reflected, so that the reflection wave RW is generated. The reflection wave RW is moved in a direction opposite to that of the incident wave IW. Here, the cavity exists between the second portion 70b and the power feeder PE11, and a length of the second portion 70b is about ¼ of the wavelength of the microwave in the atmosphere, as described above. Therefore, a phase difference of about a half wavelength is generated between the incident wave IW and the reflection wave RW. Accordingly, the incident wave IW is attenuated or cancelled by interference with the reflection wave RW. As a result, the microwave propagating through the tubular portion 60 is suppressed.

As in the case of the power feeder PE11, the power feeder PE12 is surrounded by a tubular portion 62 except for one end (lower end portion) and the other end (upper end portion) thereof. The tubular portion 62 has a substantially cylindrical shape. Further, the tubular portion 62 is made of an insulating material such as alumina or the like. The power feeder PE12 extends through an inner hole of the tubular portion 62.

In the present embodiment, the tubular portion 62 includes an upper portion 62a and a lower portion 62b. A diameter of the inner hole of the upper portion 62a is substantially equal to that of the power feeder PE12. The lower portion 62b is continued from the upper portion 62a. The diameter of the inner hole of the lower portion 62b is greater than that of the upper portion 62a. The inner surface of the lower portion 62b is separated from the outer peripheral surface of the power feeder PE12.

The tubular portion 62 is surrounded by the surrounding portion 64. The surrounding portion 64 has a through hole through which the tubular portion 62 extends. Further, the surrounding portion 64 extends along the outer peripheral surface of the tubular portion 62 while being in contact with the outer peripheral surface of the tubular portion 62.

A choke portion 72 is provided at the inner hole of the lower portion 62b of the tubular portion 62. The choke portion 72 has a function of suppressing a microwave propagating through the tubular portion 62. The choke portion 72 is made of a conductive material and includes a first portion 72a and a second portion 72b. The first portion 72a extends from the power feeder PE12 in a direction intersecting with a longitudinal direction of the power feeder PE12. For example, the first portion 72a has a disc shape having a through hole at a center thereof. The inner periphery of the first portion 72a defining the through hole is in contact with the power feeder PE12.

The second portion 72b has a cylindrical shape. The second portion 72b extends downward, between the tubular portion 62 and the power feeder PE12, from the peripheral portion of the first portion 72a. The outer peripheral surface of the second portion 72b is in contact with the inner surface of the lower portion 62b of the tubular portion 62. The inner surface of the second portion 72b is separated from the outer peripheral surface of the power feeder PE12. The second portion 72b has a length that is about ¼ of the wavelength of the microwave in the atmosphere. Specifically, the second portion 70b has one end and the other end connected to the first portion 72a. A distance between one end and the other end is about ¼ of the wavelength of the microwave in the atmosphere. As in the case of the choke portion 70, the choke portion 72 can suppress the microwave propagating through the tubular portion 62.

In order to connect the pair of power feeders PE11 and PE12 to the heater in the electrostatic chuck ESC, a hole penetrating through the pair of power feeders, the tubular portions 60 and 62 and the surrounding portion 64 needs to be formed across the lower electrode LE and the electrostatic chuck ESC. Such a hole may be a region serving as a thermal singularity of the mounting table 20. Meanwhile, the second portions of the choke portions 70 and 72 for generating a reflection wave having a phase difference that is about one half of the wavelength of the incident wave extend substantially in parallel to the power feeders. Therefore, the size of the choke portion in a plane perpendicular to the longitudinal direction of the power feeder is small. Accordingly, the hole formed across the lower electrode LE and the electrostatic chuck ESC can have a small cross section. As a result, the size of the region serving as the thermal singularity of the mounting table 20 can be reduced.

The choke portion CH has a length that is about ¼ of the wavelength of the microwave in the atmosphere and has a considerably small size compared to the wavelength of the high frequency power supplied to the lower electrode LE. Moreover, the frequency of the high frequency bias power ranges from several hundreds of KHz to ten and several MHz. Therefore, the choke portion CH hardly affects the impedance between the heater and the heater power supply.

Since the first portion of the choke portion is provided between the power feeder and the second portion of the choke portion, the cavity is ensured between the second portion and the power feeder. Accordingly, even if the second portion of the choke portion is slightly inclined with respect to the power feeder, a path for generating a reflection wave can be maintained.

Hereinafter, simulation that has been performed to evaluate the plasma processing apparatus 10 will be described. Simulation of a comparative example will be also described for comparison with the plasma processing apparatus 10.

Figure 11:
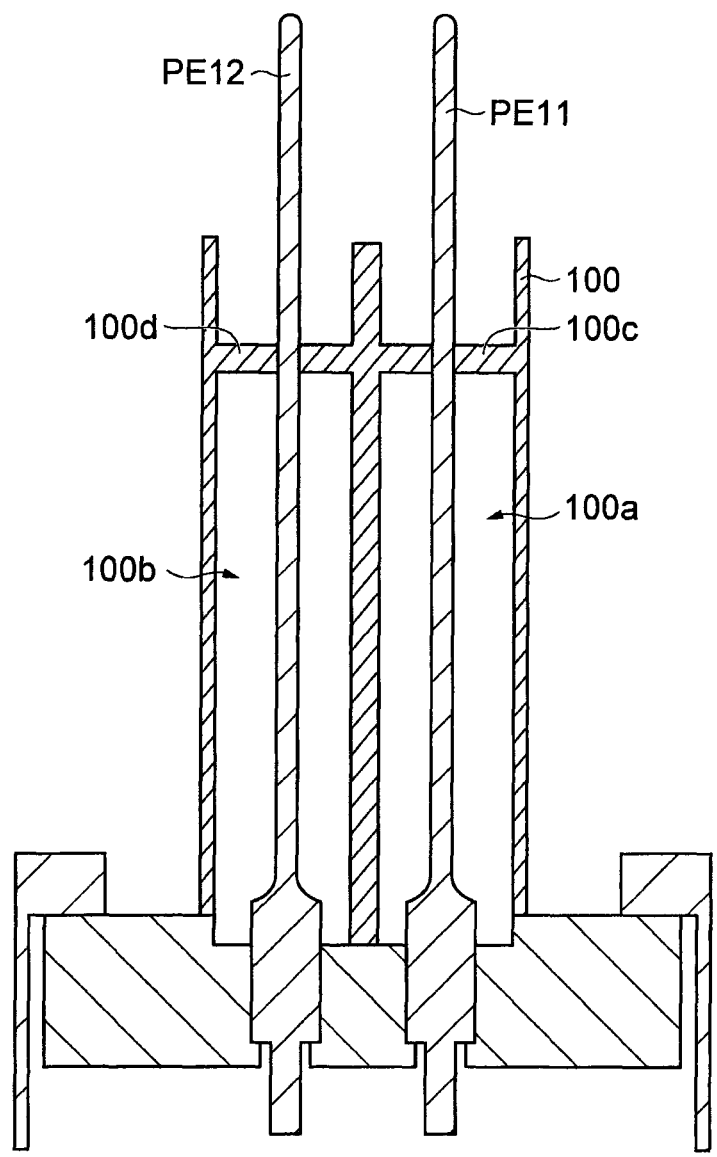
FIG. 11 shows a power supply unit of a comparative example.

First, the comparative example will be described. FIG. 11 shows a power supply unit of the comparative example. In the comparative example, the pair of power feeders PE11 and PE12 are rod-shaped conductors, as shown in FIG. 11. In the comparative example, a coating portion 100 extends in parallel to the outer peripheral surfaces of the power feeders PE11 and PE12. The coating portion 100 is made of alumina. The coating portion 100 has two through holes 100a and 100b through which the power feeders PE11 and PE12 extend. A part of the through hole 100a is reduced in diameter by a diameter reducing portion 100c and a part of the through hole 100b is reduced in diameter by a diameter reducing portion 100d. The diameter reducing portion 100c is in contact with the outer peripheral surface of the power feeder PE11 and the diameter reducing portion 100d is in contact with the outer peripheral surface of the power feeder PE12.

In this simulation, a VSWR (voltage standing wave ratio) at the tubular portion 60 was calculated while varying as parameters a length L1 (see FIG. 9) of the second portion of the choke portion and a relative dielectric constant of the tubular portion 60. Here, the VSWR can be expressed by the following Eq. (1).

$$\rho = \frac{1 + \sqrt{P_r/P_f}}{1 - \sqrt{P_r/P_f}} \quad (1)$$

In Eq. (1), $\rho$ represents a VSWR; $P_r$ represents a power of the reflection wave; and $P_f$ represents a power of the incident wave. Thus, the state in which $\rho$ is equal to 1 indicates that the microwave is not suppressed. The effectiveness of the suppression of the microwave is in direct proportion to the value of $\rho$.

Figure 12A:
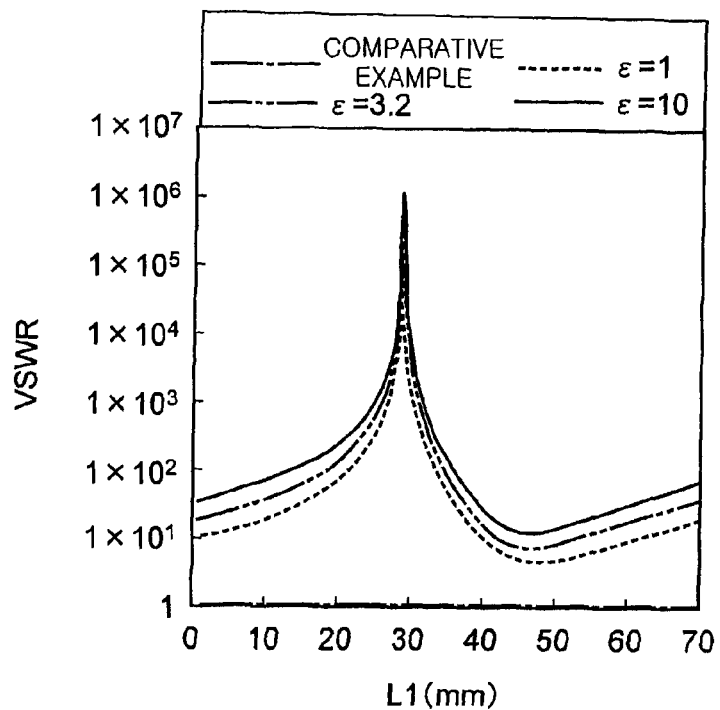
FIGS. 12A and 12B are graphs showing results of simulations of a choke portion of the plasma processing apparatus and the comparative example.
Figure 12B:
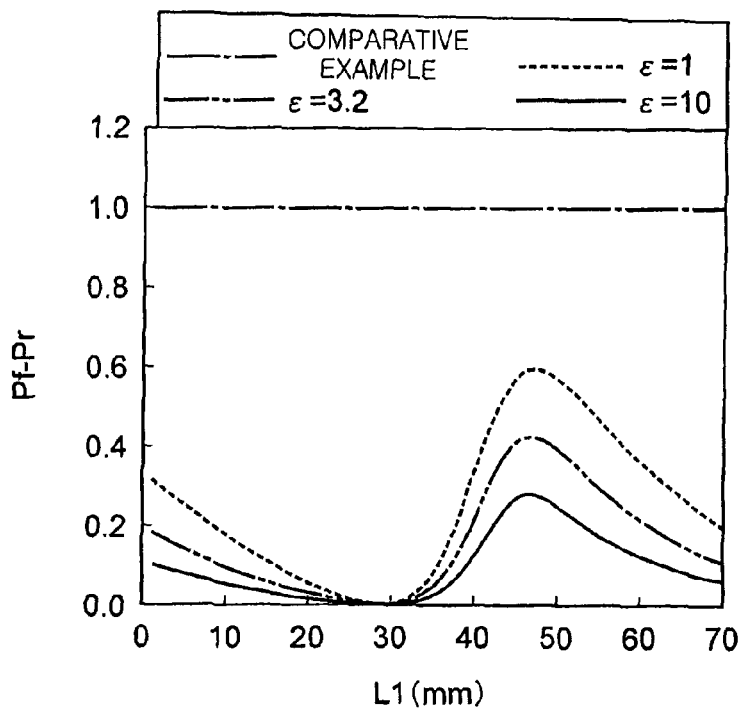

Further, the leakage amount of the microwave, i.e., $P_f - P_r$, was examined. In the same manner, in the comparative example, a VSWR and $P_f - P_r$ were calculated. FIGS. 12A and 12B are graphs showing simulation results. FIG. 12A show a VSWR of the power supply unit of the plasma processing apparatus 10 and a VSWR of the comparative example. FIG. 12A shows the VAWR of the plasma processing apparatus 10 in the case where the dielectric constant of the tubular portion 60 is about 1, 3.2 and 10, i.e., ∈=1, ∈=3.2 and ∈=10. In FIG. 12A, the horizontal axis indicates a length L1 and a vertical axis indicates a VSWR. FIG. 12B shows $P_f$-$P_r$ of the power supply unit of the plasma processing apparatus 10 and $P_f$-$P_r$ of the comparative example. FIG. 12B shows $P_f$-$P_r$ of the plasma processing apparatus 10 in the case where the dielectric constant of the tubular portion 60 is about 1, 3.2 and 10, i.e., ∈=1, ∈=3.2 and ∈=10. In FIG. 12B, the horizontal axis indicates a length L1 and the vertical axis indicates $P_f$-$P_r$.

As shown in FIG. 12A, the VSWR of the comparative example is 1. This indicates that the microwave is leaked through the coating portion 100 in the comparative example, which is also clear from $P_f$-$P_r$ of the comparative example shown in FIG. 12B, i.e., the leakage amount of the microwave. Meanwhile, in the case of using the choke portion of the power supply unit of the plasma processing apparatus 10, a high VSWR is obtained when the length L1 of the second portion of the choke portion is about ¼ of the wavelength of the microwave in the atmosphere, as can be seen from FIG. 12B. In other words, it is clear that the choke portion of the plasma processing apparatus 10 can suppress the leakage of the microwave near the power feeders PE11 and PE12, which is also clear from $P_f$-$P_r$ of the power supply unit of the plasma processing apparatus 10 shown in FIG. 12B.

Figure 13:
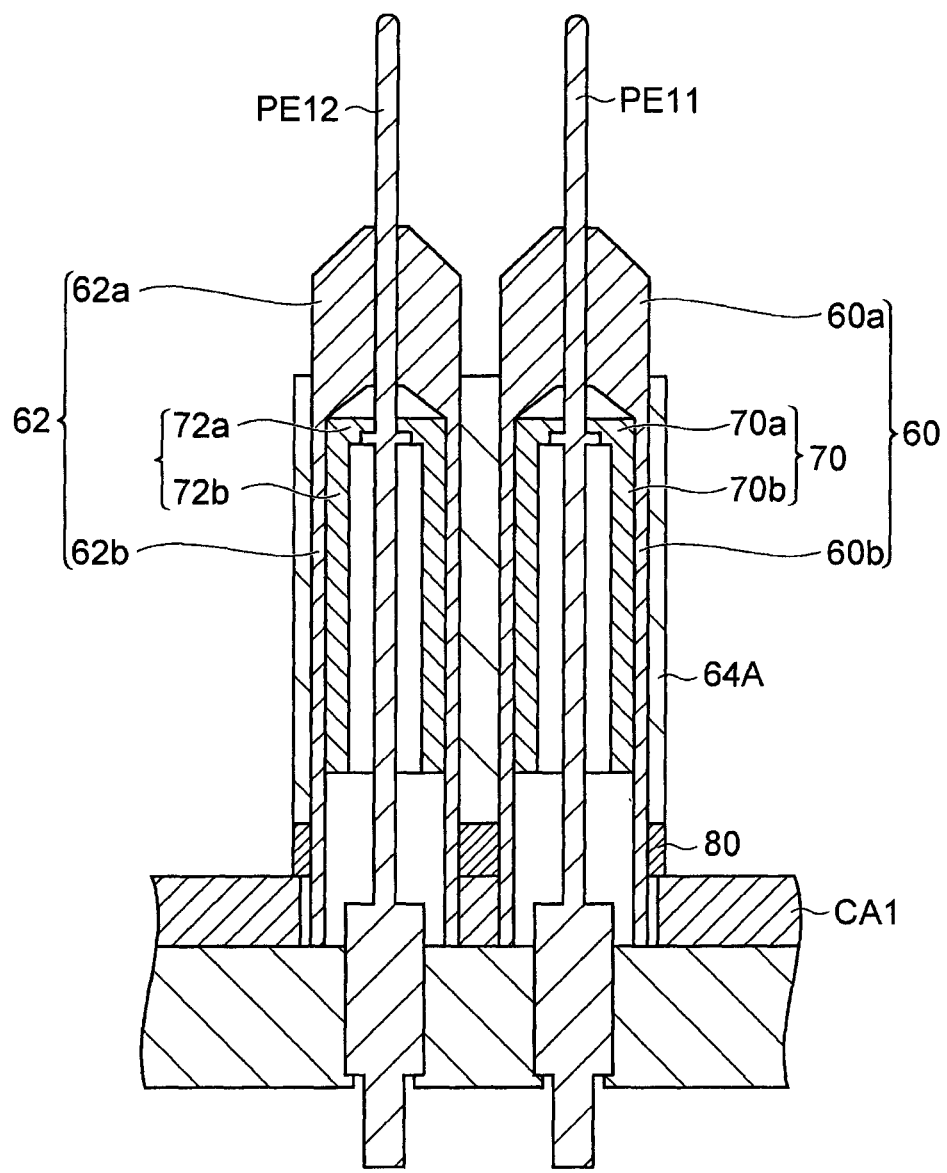
FIG. 13 shows a power supply unit in a mounting table system in accordance with another embodiment of the present invention and its neighboring components.

Hereinafter, another embodiment of the mounting table system will be described. FIG. 13 shows a structure of the power supply unit of a mounting table system in accordance with another embodiment and its neighboring components. The power supply unit shown in FIG. 13 employs a surrounding portion 64A instead of the surrounding portion 64. The surrounding portion 64A has substantially the same shape as that of the surrounding portion 64. Although the surrounding portion 64 is connected to the housing CA1 of the filter unit, the surrounding portion 64A is separated from the housing CA1.

As described above, the tubular portion 60 or 62 that is a dielectric member is disposed between the choke portion and the surrounding portion 64. Thus, the choke portion and the surrounding portion 64 can constitute the capacitor. Further, the surrounding portion 64 is connected to the housing of the filter unit, so that the capacitor can add a capacitive component to the wiring between the heater and the heater power supply. Accordingly, when the surrounding portion 64 is electrically connected to the housing CA1, the impedance between the heater and the heater power supply may be decreased.

Meanwhile, the surrounding portion 64A is separated from the housing CA1 of the filter unit. In other words, the capacitor formed by the choke portion and the surrounding portion 64A is floating from the filter of the filter unit. Accordingly, the decrease in the impedance between the heater and the heater power supply is suppressed in the case of using the surrounding portion 64A.

The following is description on a result of a test that has obtained frequency characteristics of the impedance between the heater and the heater power supply by an impedance analyzer in the case of using the surrounding portion 64, in the case of using the surrounding portion 64A and in the case of using the comparative example shown in FIG. 11. In this test, the filter of the filter unit provided between the heater and the heater power supply is set to have a predetermined impedance at 13.65 MHz in order to suppress generation of a high frequency power having a frequency of 13.65 MHz by the high frequency power supply RFG. In the comparative example shown in FIG. 11, a conductor is not provided around the coating portion 100, so that a capacitive component other than the filter of the filter unit is ignorable for the impedance between the heater power supply and the heater. In other words, the structure of the comparative example shown in FIG. 11 does not affect the impedance of the frequency of 13.65 MHz.

Figure 14:
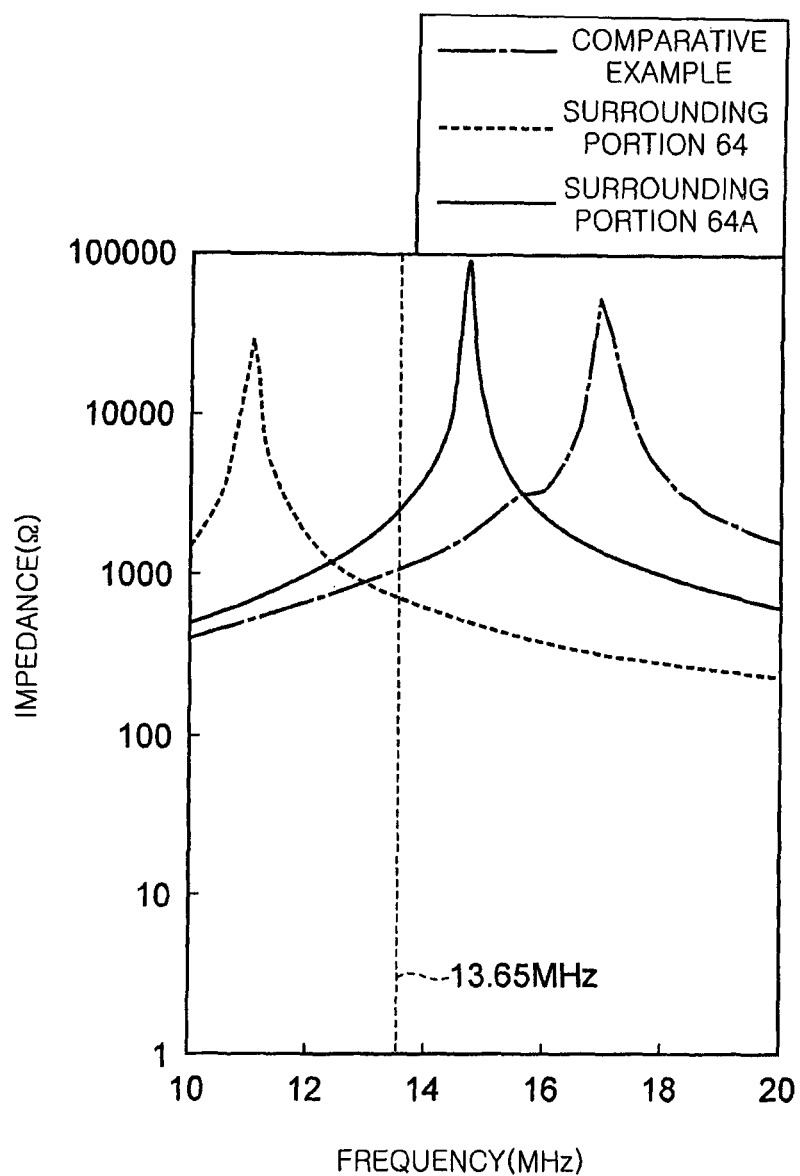
FIG. 14 is a graph showing frequency characteristics of an impedance between the heater and the heater power supply which are obtained by using an impedance analyzer in the case of using a surrounding portion 64, in the case of using a surrounding portion 64A and in the case of using the comparative example shown in FIG. 11.

FIG. 14 shows frequency characteristics of the impedance between the heater and the heater power supply which have been obtained by using an impedance analyzer in the case of using the surrounding portion 64, in the case of using the surrounding portion 64A, and in the case of using the comparative example shown in FIG. 11. In FIG. 14, the horizontal axis indicates a frequency and the vertical axis indicates an impedance. As shown in FIG. 14, at the frequency of about 13.65 MHz, the impedance in the case of using the surrounding portion 64 is slightly smaller than the impedance in the comparative example. However, at the same frequency, the impedance in the case of using the surrounding portion 64A is greater than that in the comparative example. From the above, it is clear that the decrease in the impedance between the heater and the heater power supply can be suppressed by separating the surrounding portion 64A from the housing CA1.

As shown in FIG. 13, an insulation member 80 may be provided between the surrounding portion 64A and the housing CA1 of the filter unit. Specifically, the surrounding portion 64A has one end (lower end) and the other end (upper end). The other end of the surrounding portion 64A is spaced further from the housing CA1 of the filter unit than the one end of the surrounding portion 64A. The insulation member 80 is disposed between the one end, i.e., the lower end, of the surrounding portion 64A and the housing of the filter unit. The insulation member 80 may be made of a material having a relative dielectric constant higher than that of alumina, e.g., zirconium. By using the insulation member 80, the leakage of the microwave through the space between the surrounding portion 64A and the housing can be suppressed. Further, the structure shown in FIG. 13 can be employed as a neighboring structure of the power feeders PE21 and PE22.

Although various embodiments have been described, the present invention is not limited thereto and may be variously modified. For example, the plasma processing apparatus 10 includes a radial line slot antenna as an antenna for introducing a microwave. However, it is not limited thereto and any plasma source capable of exciting a processing gas by using a microwave may be used.

In the plasma processing apparatus 10, two heaters HC and HE are provided in the electrostatic chuck ESC. However, the number of heaters provided in the electrostatic chuck is not limited to two. A single heater or three or more heaters may be provided in the electrostatic chuck ESC.

While the invention has been shown and described with respect to the embodiments, it will be understood by those skilled in the art that various changes and modifications may be made without departing from the scope of the invention as defined in the following claims.

What is claimed is:
1. A plasma processing apparatus for exciting a processing gas by using a microwave, comprising:
   a processing chamber;
   a mounting table provided in the processing chamber, the mounting table including a lower electrode and an electrostatic chuck disposed on the lower electrode;

a high frequency power supply electrically connected to the lower electrode;
a heater provided in the electrostatic chuck;
a heater power supply configured to generate a power to be supplied to the heater;
a filter unit including a filter connected to the heater power supply;
a rod-shaped power feeder which connects the heater power supply and the heater via the filter;
an insulating tubular portion having an inner hole through which the rod-shaped power feeder extends; and
a conductive choke portion serving to suppress a microwave propagating through the insulating tubular portion;
wherein the conductive choke portion includes a first portion extending from the rod-shaped power feeder in a direction intersecting with a longitudinal direction of the rod-shaped power feeder and a cylindrical second portion extending, between the insulating tubular portion and the rod-shaped power feeder, from a peripheral portion of the first portion.

2. The plasma processing apparatus of claim 1, further comprising a conductive surrounding portion provided along an outer periphery of the insulating tubular portion.

3. The plasma processing apparatus of claim 2, wherein the filter unit further includes a conductive housing and the conductive surrounding portion is separated from the conductive housing.

4. The plasma processing apparatus of claim 3, wherein the conductive surrounding portion includes opposite ends having one end and another end spaced further from the conductive housing than said one end; and
the plasma processing apparatus further comprises an insulation member provided between said one end of the conductive surrounding portion and the conductive housing.

5. The plasma processing apparatus of claim 4, wherein the insulation member is made of zirconium.

6. The plasma processing apparatus of claim 1, wherein the cylindrical second portion includes opposite ends having one end and another end connected to the first portion; and
a distance between said one end and said another end is about ¼ of a wavelength of the microwave in an atmosphere.

7. A power supply unit for connecting a heater provided in an electrostatic chuck and a heater power supply via a filter unit in a plasma processing apparatus for exciting a processing gas by using a microwave, the power supply unit comprising:
a rod-shaped power feeder which connects a filter of the filter unit and the heater;
an insulating tubular portion having an inner hole through which the rod-shaped power feeder extends; and
a conductive choke portion serving to suppress a microwave propagating through the insulating tubular portion,
wherein the conductive choke portion includes a first portion extending from the rod-shaped power feeder in a direction intersecting with a longitudinal direction of the rod-shaped power feeder and a cylindrical second portion extending, between the insulating tubular portion and the rod-shaped power feeder, from a peripheral portion of the first portion.

8. The power supply unit of claim 7, wherein the second portion includes opposite ends having one end and another end connected to the first portion; and
a distance between said one end and said another end is about ¼ of a wavelength of the microwave in an atmosphere.

9. A mounting table system for use in a plasma processing apparatus for exciting a processing gas by using a microwave, comprising:
a mounting table including a lower electrode and an electrostatic chuck disposed on the lower electrode;
a high frequency power supply electrically connected to the lower electrode;
a heater provided in the electrostatic chuck;
a heater power supply configured to generate a power to be supplied to the heater;
a filter unit having a filter connected to the heater power supply;
a rod-shaped power feeder which connects the heater power supply and the heater via the filter;
an insulating tubular portion having an inner hole through which the rod-shaped power feeder extends; and
a conductive choke portion serving to suppress a microwave propagating through the insulating tubular portion,
wherein the conductive choke portion includes a first portion extending from the rod-shaped power feeder in a direction intersecting with a longitudinal direction of the rod-shaped power feeder and a cylindrical second portion extending, between the insulating tubular portion and the rod-shaped power feeder, from a peripheral portion of the first portion.

10. The mounting table system of claim 9, further comprising a conductive surrounding portion provided along an outer periphery of the insulating tubular portion.

11. The mounting table system of claim 10, wherein the filter unit includes a conductive housing and the conductive surrounding portion is separated from the conductive housing.

12. The mounting table system of claim 11, wherein the conductive surrounding portion includes opposite ends having one end and another end spaced further from the conductive housing than said one end; and
the mounting table system further comprises an insulation member provided between said one end of the conductive surrounding portion and the conductive housing.

13. The mounting table system of claim 12, wherein the insulation member is made of zirconium.

14. The mounting table system of claim 9, wherein the cylindrical second portion includes opposite ends having one end and another end connected to the first portion; and
a distance between said one end and said another end is about ¼ of a wavelength of the microwave in an atmosphere.

* * * * *